(12) United States Patent
Williamson et al.

(10) Patent No.: US 9,934,989 B1
(45) Date of Patent: Apr. 3, 2018

(54) PROCESS FOR FORMING LEADFRAME HAVING ORGANIC, POLYMERIZABLE PHOTO-IMAGEABLE ADHESION LAYER

(71) Applicant: TEXAS INSTRUMENTS INCORPORATED, Dallas, TX (US)

(72) Inventors: Jaimal Mallory Williamson, McKinney, TX (US); Bernardo Gallegos, McKinney, TX (US); Jose Carlos Arroyo, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/282,534

(22) Filed: Sep. 30, 2016

(51) Int. Cl.
*H01L 21/48* (2006.01)
*H01L 23/495* (2006.01)
*H01L 23/498* (2006.01)

(52) U.S. Cl.
CPC ...... *H01L 21/4832* (2013.01); *H01L 21/4821* (2013.01); *H01L 21/4825* (2013.01); *H01L 23/4951* (2013.01); *H01L 23/49558* (2013.01); *H01L 23/49586* (2013.01); *H01L 23/49861* (2013.01)

(58) Field of Classification Search
CPC ............. H01L 21/4821; H01L 21/4832; H01L 21/4825

See application file for complete search history.

(56) References Cited

U.S. PATENT DOCUMENTS

| | | | | |
|---|---|---|---|---|
| 5,986,335 | A * | 11/1999 | Amagai | H01L 23/4951 257/666 |
| 7,335,536 | B2 * | 2/2008 | Lange | H01L 24/11 257/E21.507 |
| 2007/0001278 | A1 * | 1/2007 | Jeon | H01L 23/49558 257/676 |
| 2009/0283884 | A1 * | 11/2009 | Kang | H01L 21/4832 257/676 |
| 2012/0091569 | A1 * | 4/2012 | Appelt | H01L 21/4821 257/676 |
| 2012/0153447 | A1 * | 6/2012 | Jiang | H01L 21/563 257/673 |

* cited by examiner

*Primary Examiner* — Michael Jung
(74) *Attorney, Agent, or Firm* — Rose Alyssa Keagy; Charles A. Brill; Frank D. Cimino

(57) ABSTRACT

A lead frame that is partially covered with an adhesion layer. A method for forming a lead frame with an adhesion layer starting with a lead frame and using a photo-imageable polyimide or epoxy material to form the adhesion layer. A method for forming a lead frame with an adhesion layer starting with a lead frame blank and using a photo-imageable polyimide or epoxy material to form the adhesion layer.

24 Claims, 17 Drawing Sheets

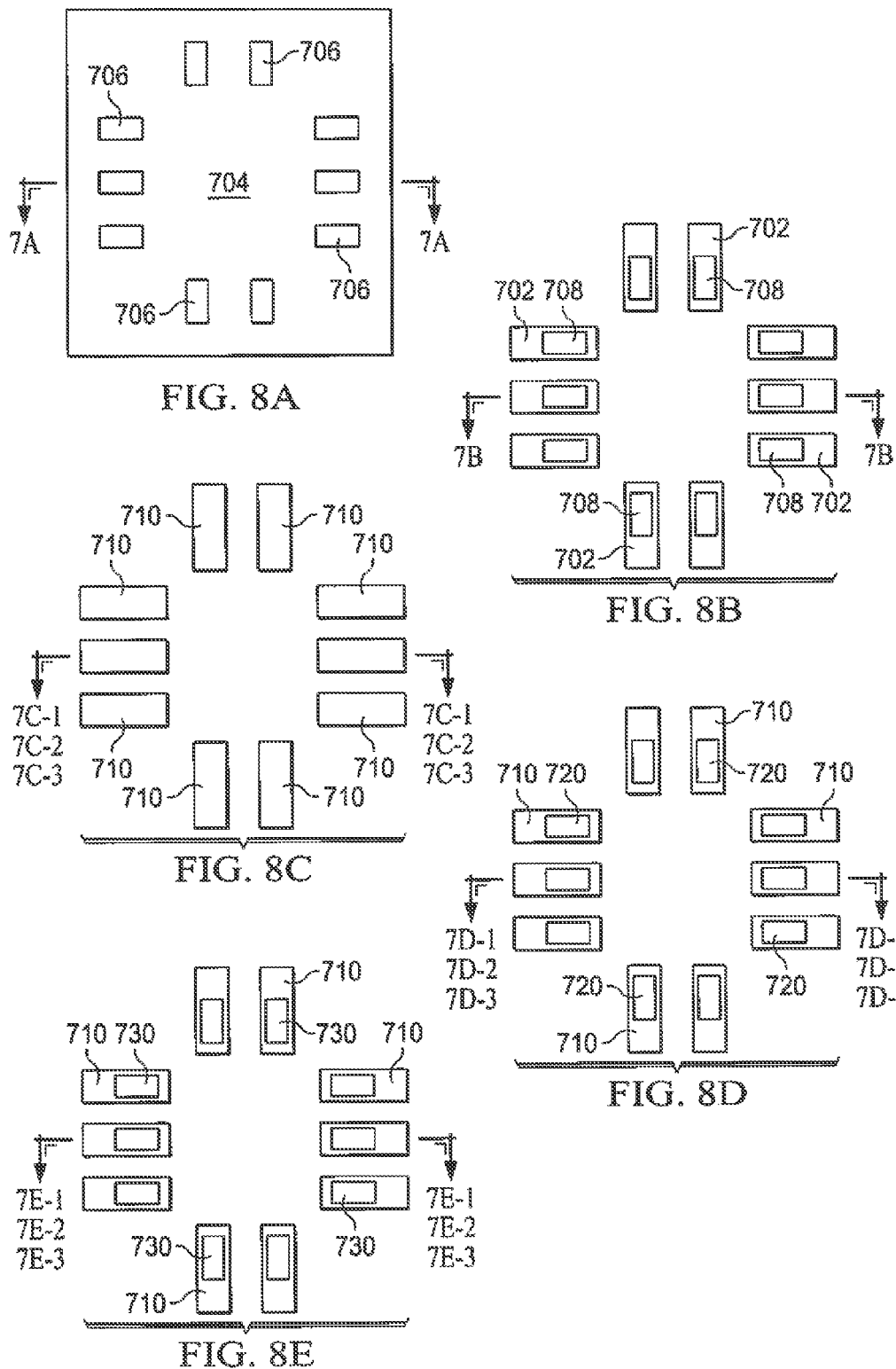

PROCESS FOR FORMING LEADFRAME HAVING ORGANIC, POLYMERIZABLE PHOTO-IMAGEABLE ADHESION LAYER

FIELD

This disclosure relates to the field of packaged integrated circuits. More particularly, this disclosure relates to an adhesion layer on a lead frame in a packaged integrated circuit.

DESCRIPTION OF THE VIEWS OF THE DRAWINGS

FIGS. 8A through 8E are plan views of the embodiment lead frames of FIGS. 3A, 3B, 3C, and 3D depicted in successive stages of fabrication using the first method.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 1A:
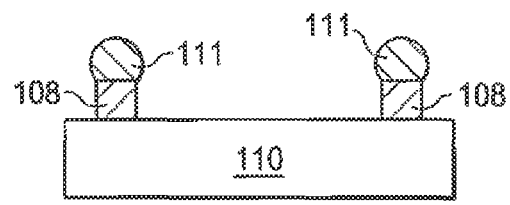
FIGS. 1A, 1B, and 1C are cross-sections of a packaged integrated circuit.
Figure 1B:
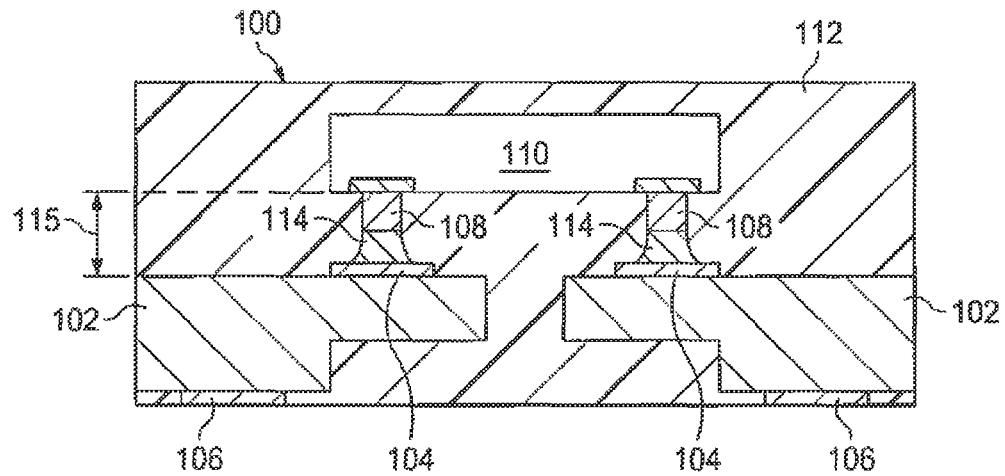
Figure 1C:
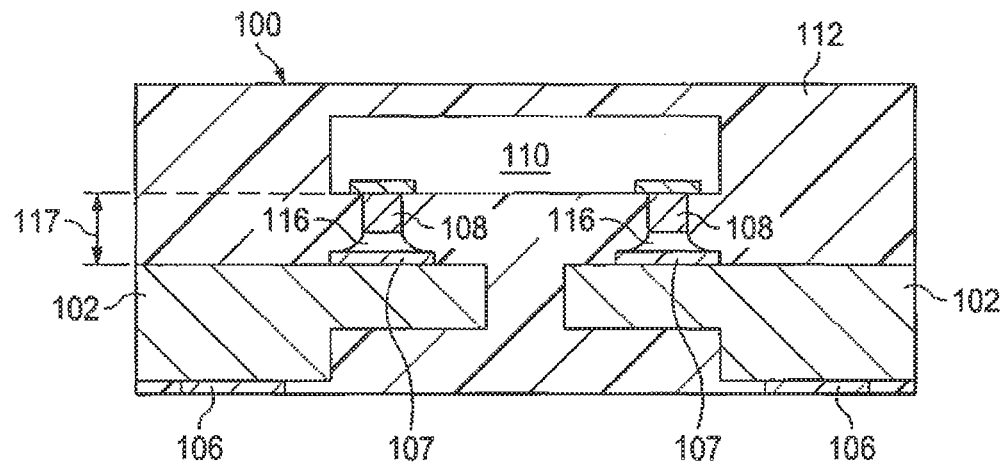

A quad-flat no lead (QFN) packaged integrated circuit is illustrated in FIGS. 1A, 1B, and 1C.

FIG. 1A illustrates an Integrated circuit chip (IC) 110 with copper posts 108 topped with solder 111. This IC chip 110 is flipped upside down and the solder 111 is heated to cause it to reflow and bond to solderable pads 104 on a lead frame 102 as shown in FIG. 1B.

FIG. 1B shows the IC 110 of FIG. 1A bonded to a lead frame 102 and encapsulated in molding compound 112. Typically the lead frame 102 is copper or a copper alloy coated with an anti-tarnish material to retard oxidation. The solder 111 is heated to form a reflowed solder joint 114 between the copper post 108 and the solderable pads 104 on the lead frame 102. The solderable pads 104 typically are composed of a metal or composite metal that is electroplated onto the lead frame 102. The solderable pad 104 may be a metal such as palladium on nickel or palladium/nickel/gold. The IC chip 110 and lead frame 102 may then be encapsulated in molding compound 112 such as a filled epoxy to form packaged IC 100. The molding compound 112 in a QFN packaged IC 100 directly contacts the lead frame 102 metal. Surface mount pads 106 on the bottom side of the lead frame 102 may be used when attaching the packaged IC 100 to a circuit board.

The distance 115 (FIG. 1B) between the IC chip 110 and the lead frame 102 depends upon the extent to which the solder 111 reflows when forming the solder joint 114. The height 115 of solder joint 114 in FIG. 1B is greater than the height 117 of solder joint 116 in FIG. 1C because the solder in FIG. 1B reflowed less. Increased solder joint height reduces stress on the solder joint during temperature changes. Solder joints with increased height are less susceptible to failure.

Figure 2:
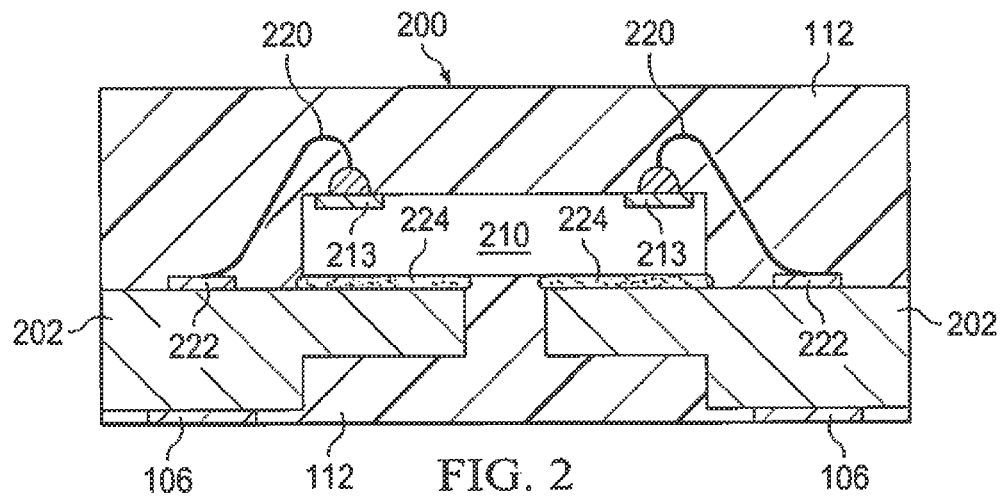
FIG. 2 is a cross section of a packaged wire bond integrated circuit.

A QFN packaged wire bond integrated circuit 200 is illustrated in FIG. 2. The IC chip 210 is attached to the lead frame 202 with an adhesive layer 224. Wire bonds 220 electrically connect bond pads 213 on the IC chip 210 to wire bond pads 222 on the lead frame 202. The IC chip 210 and lead frame 202 are encapsulated with a molding compound 112 to form the packaged wire-bonded integrated circuit 200.

Figure 3A:
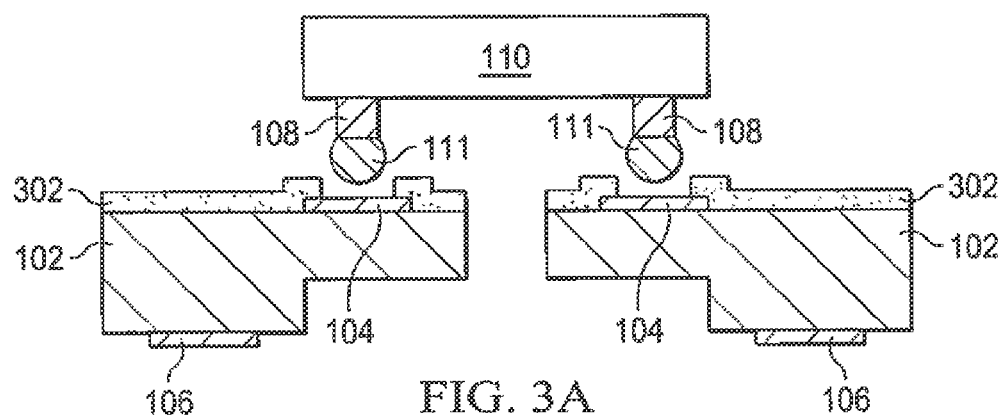
FIGS. 3A and 3B are cross-sections illustrating the attachment of a packaged integrated circuit to an embodiment lead frame with adhesion layer.
Figure 3B:
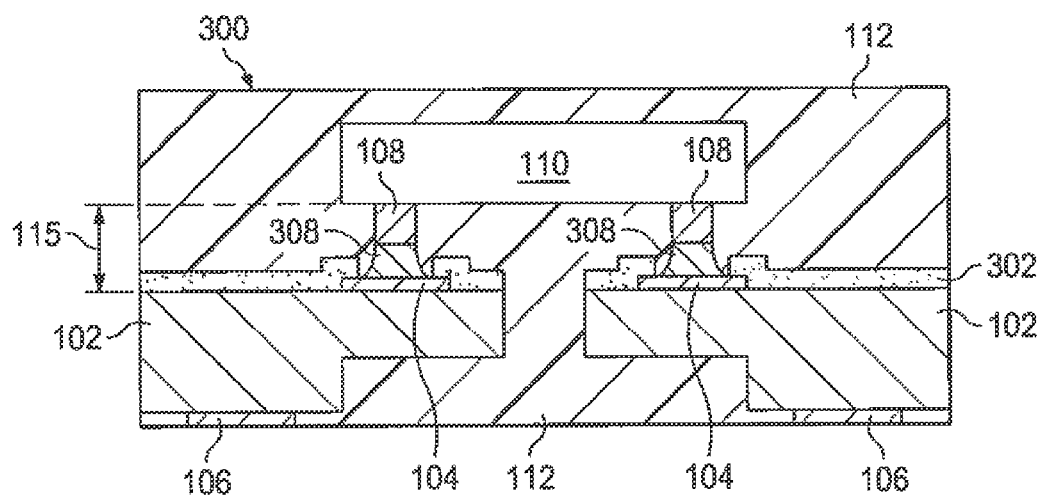

An embodiment ball bond packaged integrated circuit 300 is shown in FIG. 3B. The embodiment adhesion layer 302 between the molding compound 112 and the lead frame 102 significantly reduces delamination and failure during moisture sensitivity limit (MSL) testing and during thermal cycling testing.

As is illustrated in FIGS. 3A and 3B the adhesion layer 302 may partially cover the solderable pads 104 on the lead frame 102. The opening in the adhesion layer 302 over the solderable pad 104 is smaller than the surface of the solderable pad 104 and it limits the reflow area of the solder 111 during the formation of the solder joint 308.

Shown in FIG. 3A is an IC chip 110 with copper posts 108 topped with solder 111 just prior to being soldered to an embodiment lead frame 102.

As shown FIG. 3B the opening in the adhesion layer 302 over the solderable pad 104 is smaller than the solderable pad 104 and it limits the lateral flow of the solder during formation of the solder joint 308. This increases the height of the solder joint 308 and therefore increases the distance 115 between the lead frame 102 and the IC chip 110. This increased distance 115 improves reliability by reducing the stress imposed on the solder joint 308 during temperature changes. The height of the solder joint 308 is related to the thickness of the adhesion layer 302. In this embodiment, the height of the solder joint 308 is at least the thickness of the adhesion layer 302. However, the height of the solder joint 308 may be greater than the thickness of the adhesion layer 302. Moreover, height of the solder joint 308 may be increased by increasing the thickness of the adhesion layer 302.

In addition to reducing failures due to delamination of the molding compound 112 from the lead frame 102 and reducing failures by reducing stress on the solder joints 308 during temperature changes, the adhesion layer 302 also reduces manufacturing cost by eliminating the need to apply an anti-tarnish coating to the lead frame 102 during lead frame manufacture. The adhesion layer 302 may also reinforce the lead frame, thereby preventing warpage during molding.

The adhesion of molding compounds 112 (such as filled epoxies) to lead frame 102 metals (such as copper or copper alloy) is typically poor. Therefore, adhesion failures may occur during moisture sensitivity limit testing (MSL) and during thermal cycling reliability testing. The adhesion layer 302 may be an organic material such as a photo-imageable polyimide or epoxy that may be used during the manufacture of circuit boards. The adhesion layer 302 adheres strongly to the lead frame 102 metal and also adheres strongly to the molding compound 112, providing superior adhesion compared to the typical mold compound to lead frame interface in a QFN device. Depending upon the material used for the adhesion layer 302 and the molding compound 112; strong covalent bonds may form between the adhesion layer 302 and the molding compound 112.

Figure 3C:
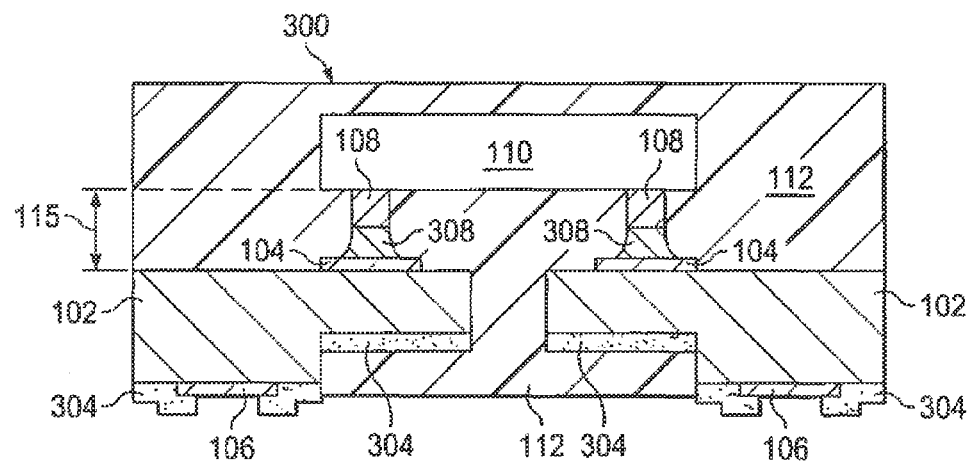
FIGS. 3C, 3D, and 3E are cross-sections of a packaged integrated circuit with adhesion layers formed in accordance with embodiments.

As shown in FIG. 3C, an adhesion layer 304 may cover a portion of the horizontal bottom surface of the lead frame 102 to promote adhesion between the lead frame 102 and the molding compound 112. The adhesion layer 304 may also partially cover the lead frame surface mount pads 106 on the bottom side of the lead frame 102.

Figure 3D:
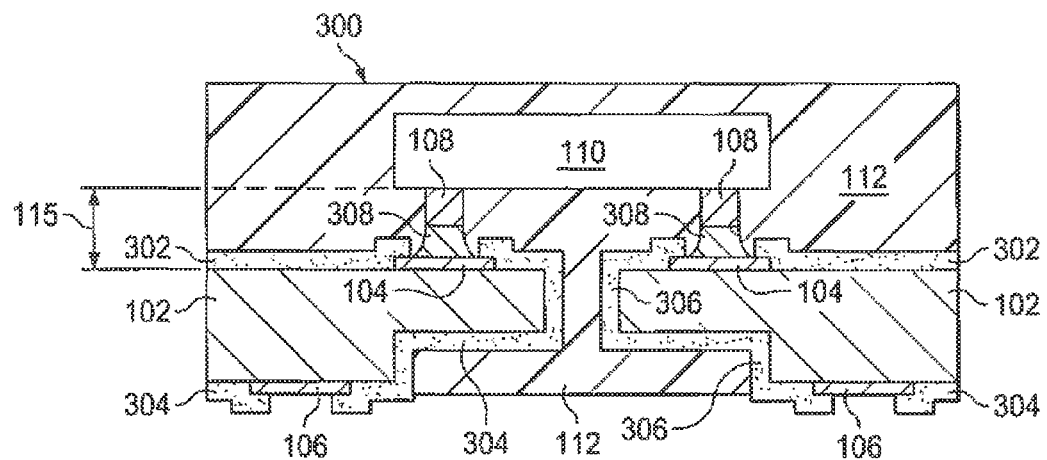

As shown in FIG. 3D, the adhesion layer 302 may cover the horizontal top surfaces of the lead frame 102, the adhesion layer 304 may cover the horizontal bottom surfaces, and an adhesion layer 306 may cover vertical surfaces of the lead frame 102 to promote adhesion between the lead frame 102 and the molding compound 112.

Figure 3E:
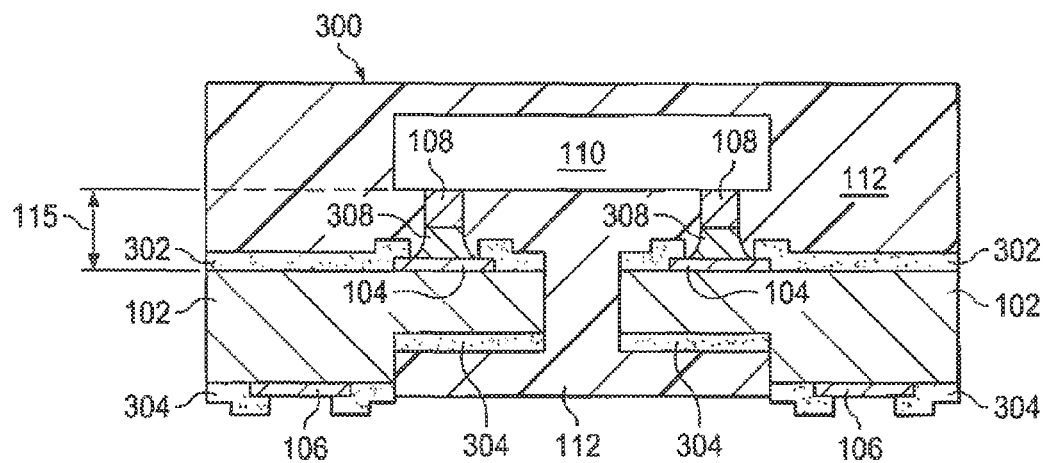

As shown in FIG. 3E, the adhesion layer 302 may cover the horizontal top surfaces of the lead frame 102 and the adhesion layer 304 may cover horizontal bottom surfaces of the lead frame 102 to promote adhesion between the lead frame 102 and the molding compound 112.

Figure 4A:
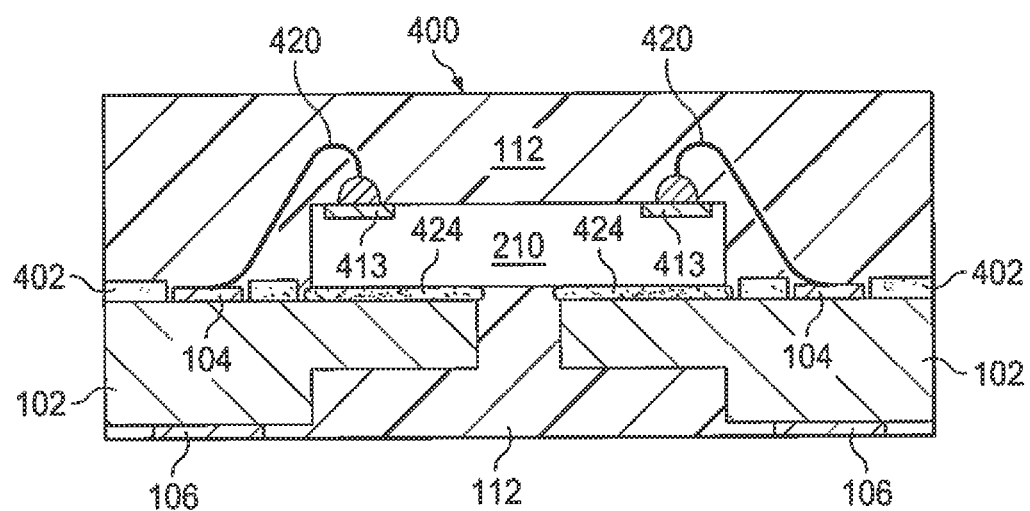
FIGS. 4A through 4D are cross-sections of a packaged wire bonded integrated circuit with adhesion layers formed in accordance with embodiments.

Shown in FIG. 4A is an embodiment of a packaged wire bonded IC 400. An adhesion layer 402 may cover the horizontal top surfaces of the lead frame 102 to promote adhesion between the horizontal top surfaces of the lead frame 102 and the molding compound 112. The IC chip 210 is attached to the lead frame 102 with an adhesive 424. Wire bonds 420 electrically connect bond pads 413 on the IC chip 210 to the wire bond pads 104 on the lead frame 102. The IC chip 210, lead frame 102, wire bonds 420, and adhesive layer 402 are encapsulated with molding compound 112 to form the embodiment of the packaged wire bonded IC 400.

Figure 4B:
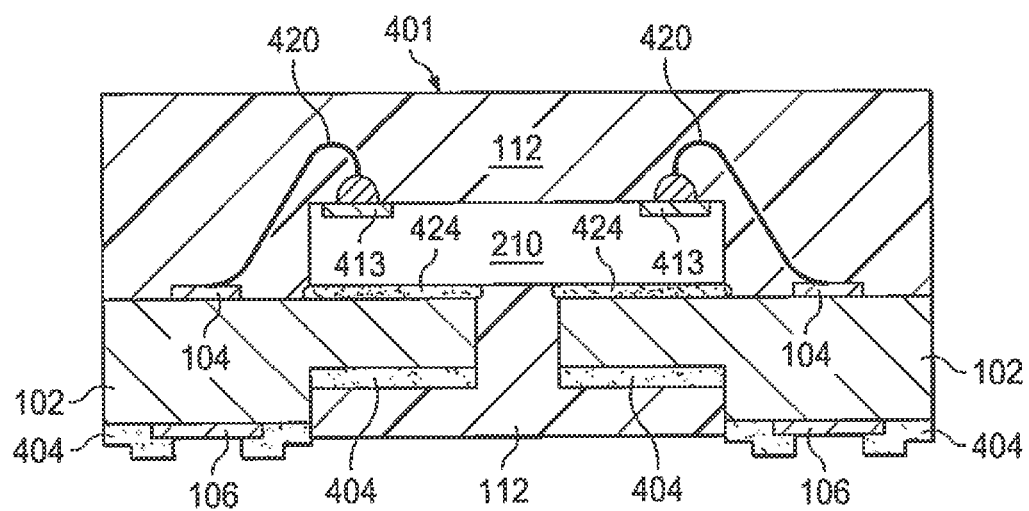
Figure 4C:
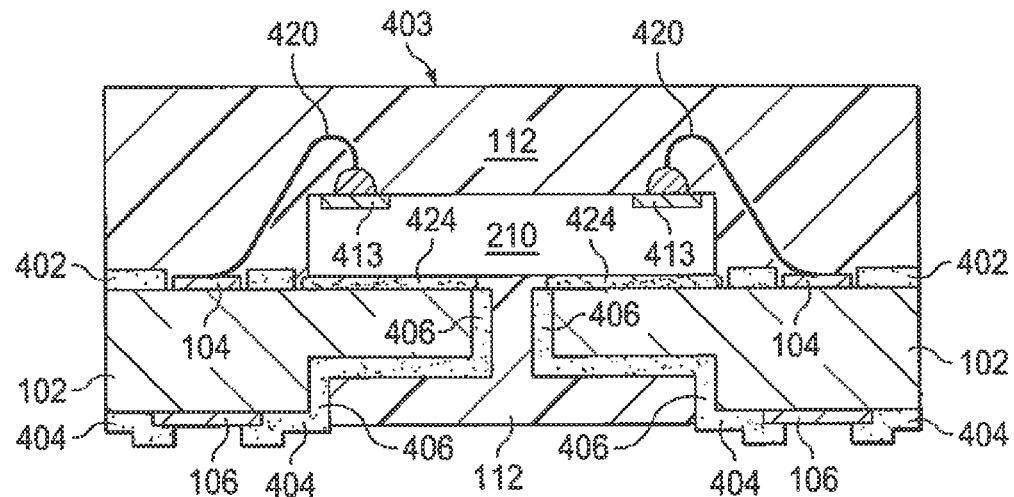

Shown in FIG. 4B is another embodiment of a packaged wire bonded IC 401. An adhesion layer 404 may cover the horizontal bottom surfaces of the lead frame 102 to promote adhesion between the horizontal bottom surfaces of the lead frame 102 and the molding compound 112. The adhesion layer 404 may also cover an outer portion the surface mount pads 106 on the bottom side of the lead frame 102.

Shown in FIG. 40 is another embodiment of a packaged wire bonded IC 403. Adhesion layer 402 may cover a portion of the horizontal top surfaces of the lead frame 102. Adhesion layer 406 may also cover a portion of the vertical surfaces of the lead frame 102. Adhesion layer 404 may partially cover the horizontal bottom surfaces of the lead frame 102. Adhesion layer 404 may also cover an outer portion of the lead frame surface mount pads 106.

Figure 4D:
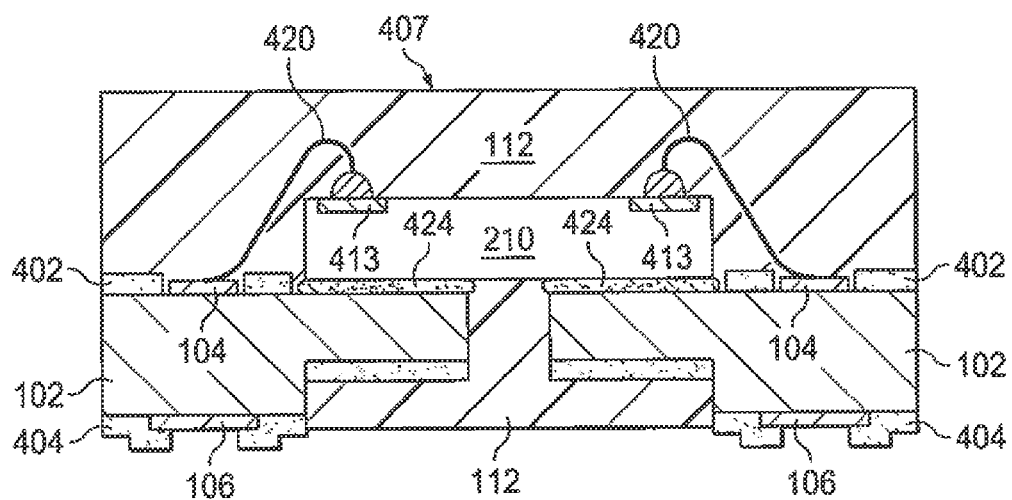

FIG. 4D illustrates another embodiment of a packaged wire bonded IC 407 where the adhesion layers 402 and 404 are deposited using a technique such as screen printing or roller coating that covers the top and bottom horizontal surfaces of the lead frame 102 but does not cover the vertical surfaces.

Figures 1, 5A:
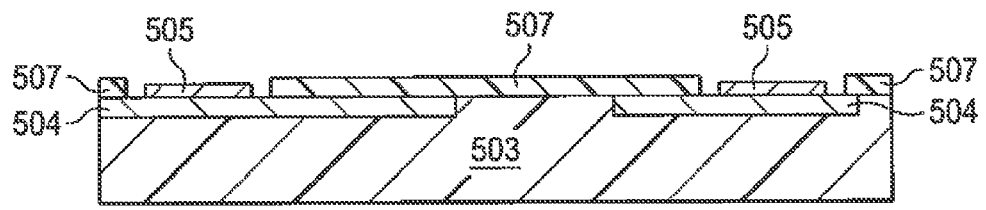
FIGS. 5A-1 through 5D are cross-sections illustrating the attachment of a packaged integrated circuit with an embodiment lead frame to a circuit board.
Figures 2, 5A:
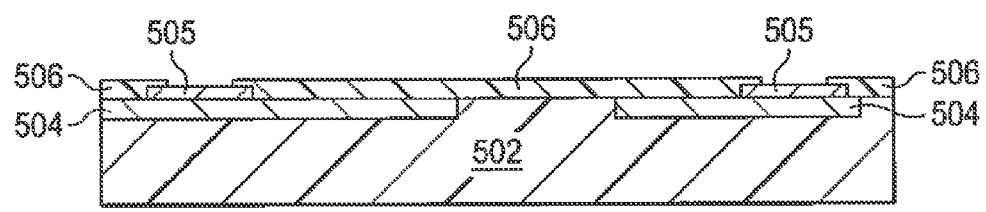
Figures 1, 5B:
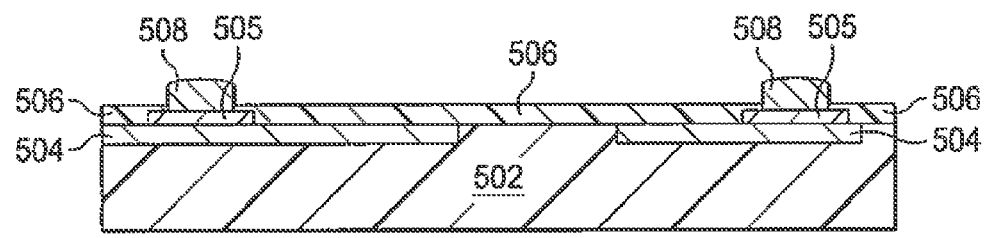
Figures 2, 5B:
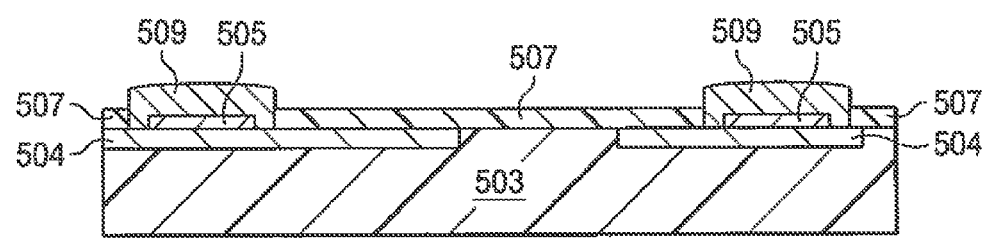
Figure 5C:
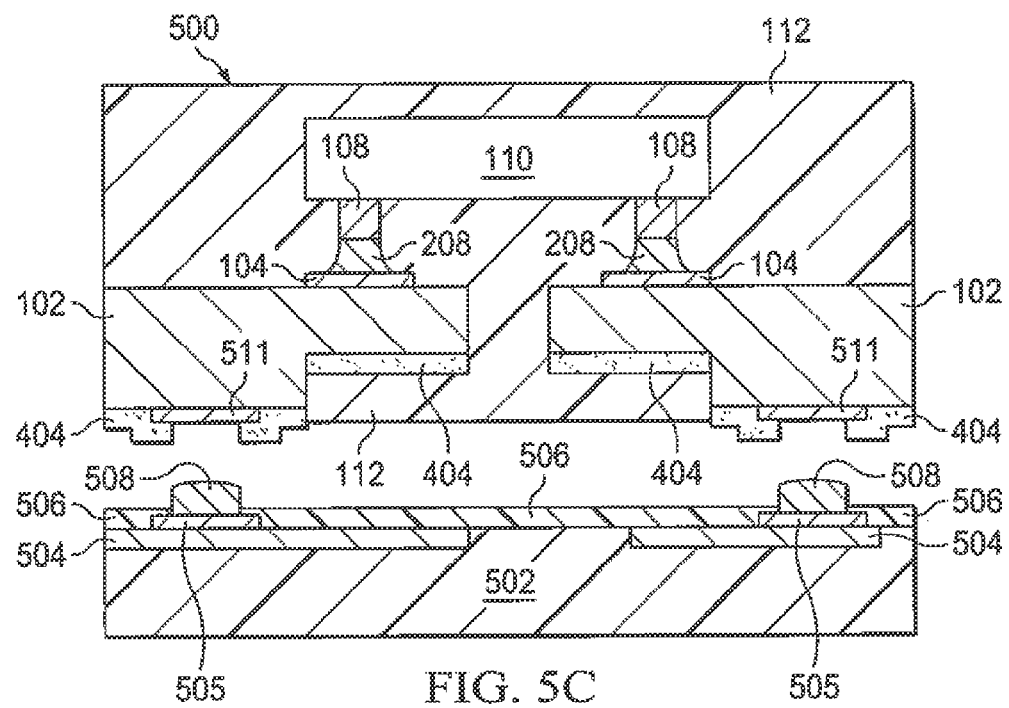
Figure 5D:
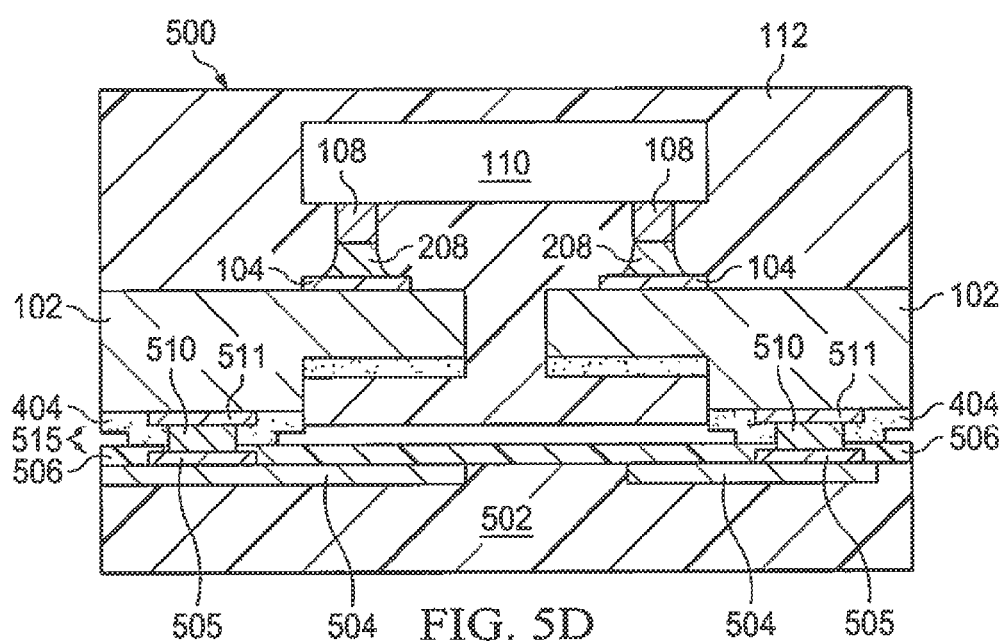

FIGS. 5A-1 through 5D illustrate the attachment of an embodiment packaged IC 500 to a circuit board 502.

FIGS. 5A-1 and 5A-2 show integrated circuit boards 502 and 503 with metallic leads 504 and with circuit board surface mount pads 505 on the topside of the circuit boards 502 and 503. In FIG. 5A-1 a solder mask 507 covers the top side of the printed circuit board 503 and partially covers the leads 504. The solder mask 507 on this circuit board 503 does not cover the circuit board surface mount pads 505. In FIG. 5A-2 a solder mask 506 covers the top side of the printed circuit board 502 and covers the leads 504. However, the solder mask 506 on this circuit board 502 also covers an outer portion of the circuit board surface mount pads 505. The solder patterns 506 and 507 may be formed using a photo-imageable polyimide or epoxy.

In a subsequent manufacturing step, a template with openings over the circuit board surface mount pads 505 is used to screen print solder paste 508 and 509 onto the circuit board surface mount pads 505. FIGS. 5B-1 and 5B-2 show the integrated circuit board 502 with screen printed solder paste 508 and 509 posts on the circuit board surface mount pads 504 where the lead frame surface mount pads 511 on the packaged IC 500 are to be attached by soldering.

FIG. 5C shows the packaged IC 500 with the lead frame surface mount pads 511, positioned over the solder paste posts 508 prior to heating and reflowing the solder paste to form solder joints 510.

FIG. 5D shows the packaged IC 500 with the lead frame surface mount pads 511 attached to the circuit board surface mount pads 505 by solder joints 510 after solder reflow.

The adhesion layer 404 which partially covers the lead frame surface mount pads 511 limits the lateral reflow of the solder paste 508. The limited lateral flow of the solder paste 508 increases the height of the solder joint 510. The Increased height increases the distance 515 between the circuit board 502 and the packaged IC 500. The increased distance 515 reduces the stress imposed on the solder joint 510 during temperature changes. The adhesion layer 404 reduces solder joint 510 failures, thus improving reliability. The height of the solder joint 510 is at least equal to the thickness of the adhesion layer 404. Moreover, the distance 515 between packaged IC 500 and the circuit board 502 may be increased by increasing the thickness of the adhesion layer 404 if desired.

Figure 6A:
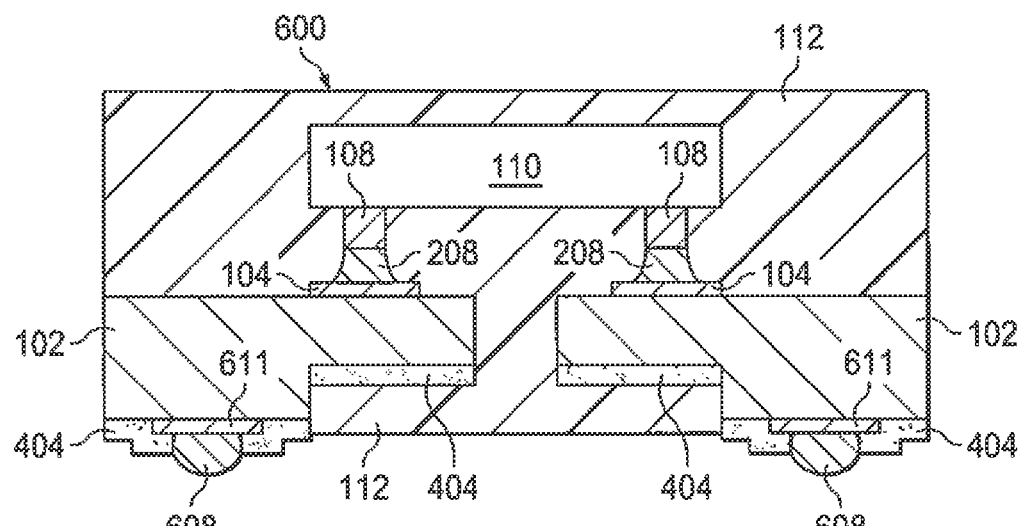
FIGS. 6A through 6C are cross-sections illustrating the attachment of a packaged integrated circuit with an embodiment lead frame to a circuit board.
Figure 6B:
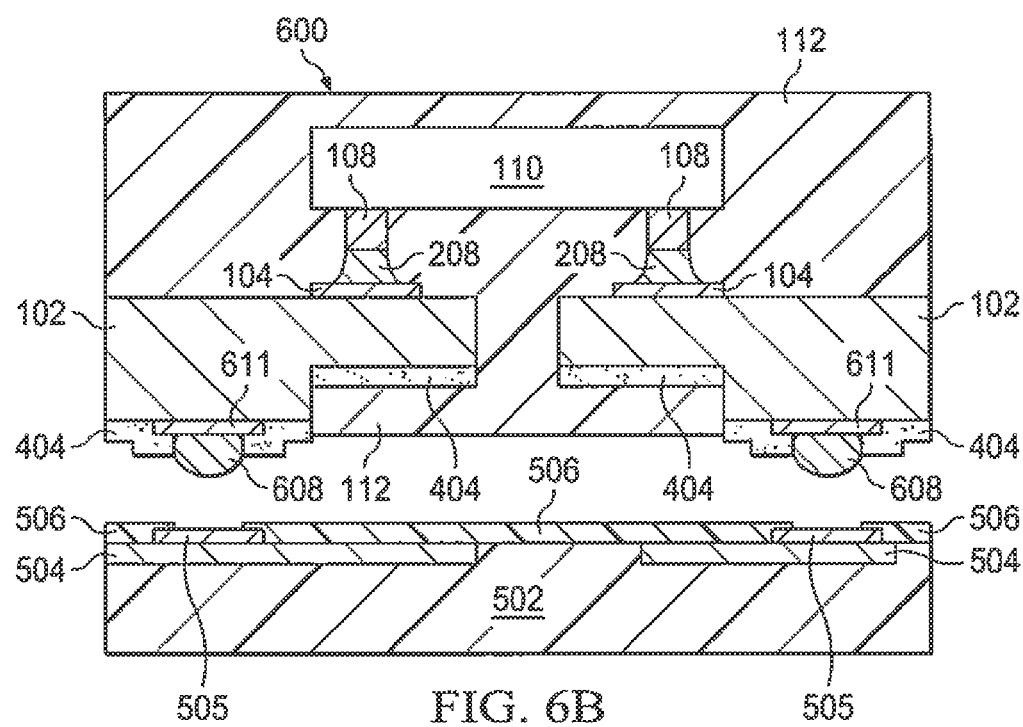
Figure 6C:
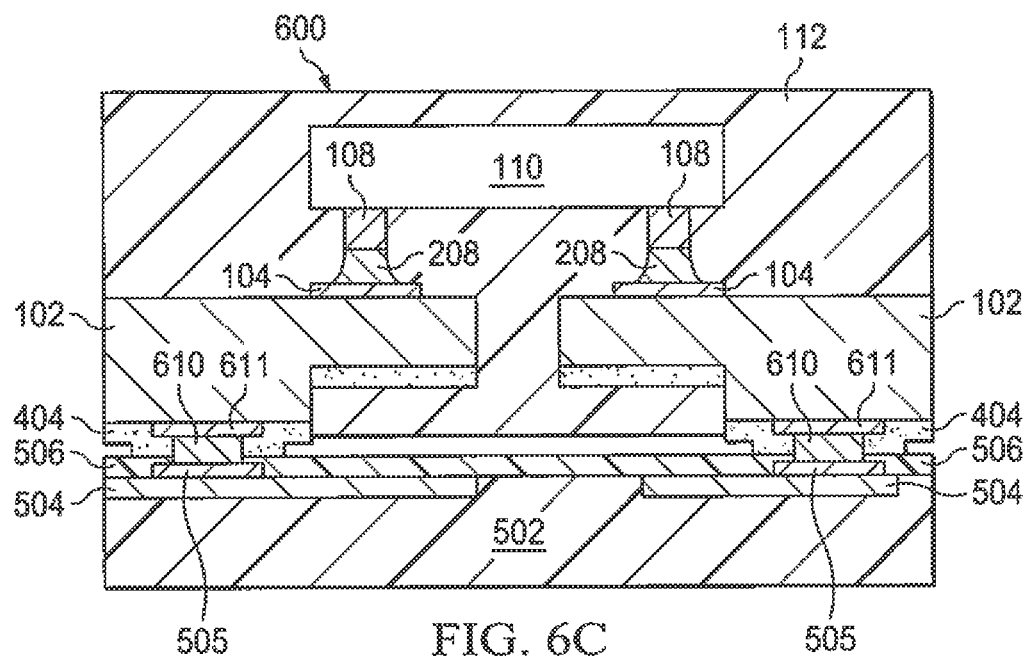

FIGS. 6A through 6C illustrate another method of attachment of an embodiment packaged IC 600 to a circuit board 502.

FIG. 6A shows a packaged IC 600 with solder balls 608 formed on the lead frame surface mount pads 611.

FIG. 6B shows the packaged IC 600 with the solder balls 608, positioned over the circuit board surface mount pads 505 prior to heating and reflowing the solder paste to form solder joints 610.

FIG. 6C shows the packaged IC 600 attached to the circuit board surface mount pads 505 with solder joints 610 after reflow.

The adhesion layer 404 which partially covers the lead frame surface mount pads 611 limits the lateral reflow of the solder. The limited lateral flow of the solder increases the height of the solder joint 610. The Increased height of the solder joint 610 increases the distance 615 between the circuit board 502 and the packaged IC 600. The increased distance 615 reduces the stress imposed on the solder joint 610 during temperature changes. Solder joint 610 failures are reduced by the use of the adhesion layer 404, thus improving reliability. The height of the solder joint 610 is at least the thickness of the adhesion layer 404. Moreover, the distance 615 between packaged IC 600 and the circuit board 502 may be increased by increasing the thickness of the adhesion layer 404.

A first method for a forming the embodiment lead frames described in FIGS. 3A, 3B, 3C, 3D, and 3E is illustrated in the cross sections of the selected processing steps in FIGS. 7A through 7E-4. Corresponding plan views of the lead frame are shown in FIGS. 8A through 8E.

Figure 7A:
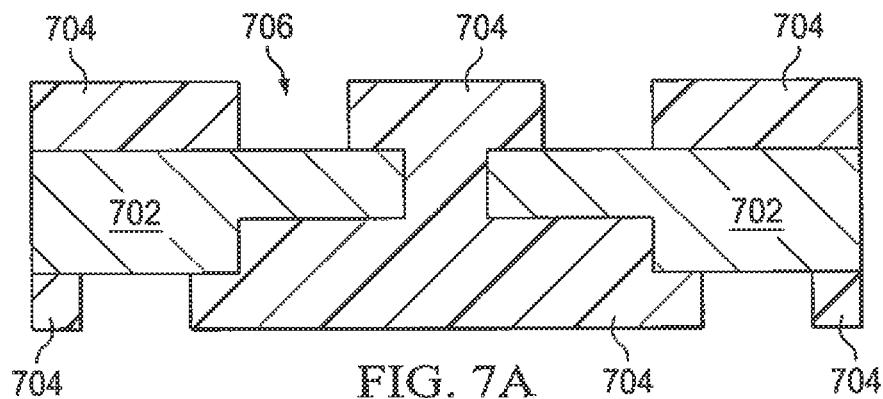
FIGS. 7A through 7E-4 are cross sections of the embodiment lead frames of FIGS. 3A, 3B, 3C, and 3D depicted in successive stages of fabrication using a first method.

FIG. 7A shows a lead frame 702 with a bond pad pattern 704. As shown in the top side plan view in FIG. 8A, the bond pad pattern 704 covers the lead frame 702. Openings 706 in the bond pad pattern 704 expose the lead frame 702 metal for electroplating.

Figure 7B:
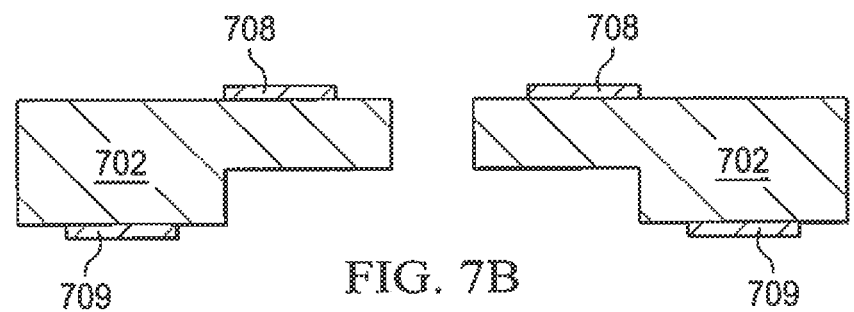

As shown in FIG. 7B, openings 706 in the bond pad pattern 704 enable solderable bond pads 708 or wire-bond pads 708 to be electroplated onto the top side of the lead frame 702 and to enable lead frame surface mount pads 709 to be electroplated onto the bottom side of the lead frame 702. The lead frame 702 is typically copper or a copper alloy. Once the solderable pads or wire bond pads 708 and the lead frame surface mount pads 709 are electroplated, the bond pad pattern 704 is removed. The solderable bond pad 708, wire-bond pad 708, and lead frame surface mount pad 709 are typically a metal such as palladium on nickel or gold on palladium on nickel or tin. FIG. 8B shows a plan top side view of the lead frame 702 with solderable pads 708 or wire-bond pads 708.

FIGS. 7C-1, 7C-2, 7C-3, and 7C-4 illustrate four different embodiment lead frames that may be formed depending upon how and where the embodiment adhesion layers, 710, 712, and 714, are deposited. These examples are for illustrative purposes and are not meant to be limiting. The adhesion layers 710, 712, and 714 may be an organic material similar to that used to build-up IC circuit boards. These organic materials may be a photo-imageable polyimide or epoxy material and may be deposited by roller coating, screen printing, ink jet printing or may be electro coated with an electro deposited ink.

The embodiment lead frame structures shown in FIGS. 7C-1, 7C-2, and FIG. 7C-3 may be formed by depositing the adhesion layers, 710, and 712, using roller coating, screen printing, ink jet printing or another technique that deposits the adhesion layers 710 and 712 on horizontal surfaces. The thickness of the adhesion layers, 710 and 712, may be in the range of about 1 um to 50 um. In an example embodiment lead frame the thickness of the adhesion layers, 710 and 712, are about 5 um.

Figures 1, 7C:
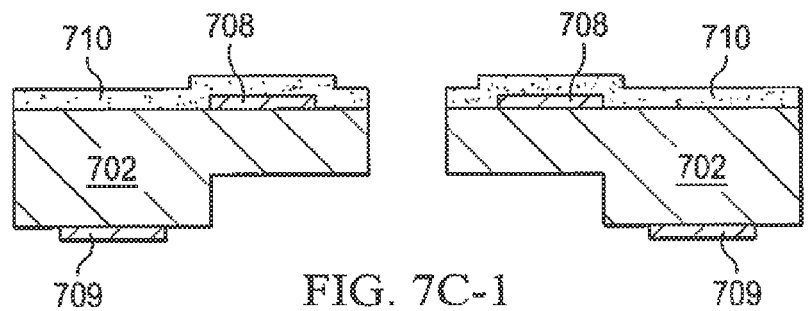
Figures 2, 7C:
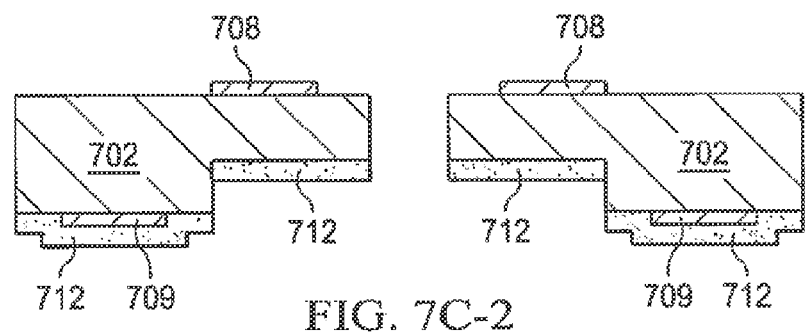
Figures 3, 7C:
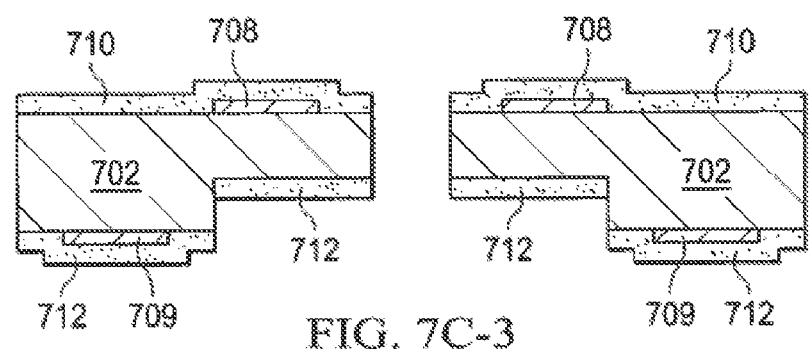
Figures 4, 7C:
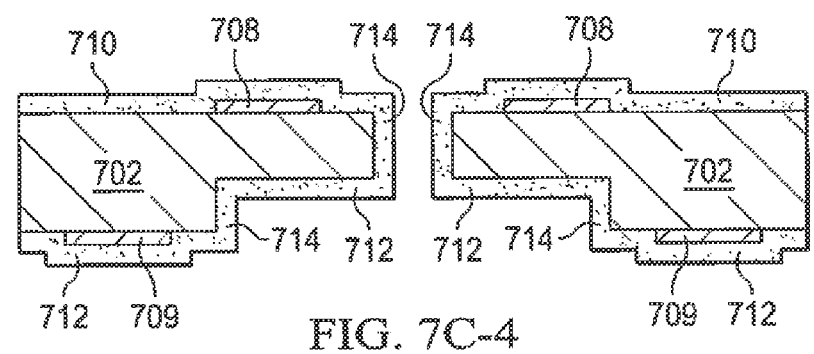
Figures 1, 7D:
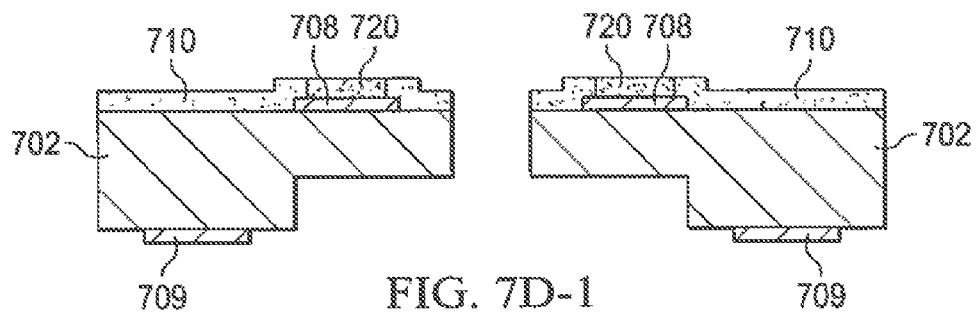
Figures 2, 7D:
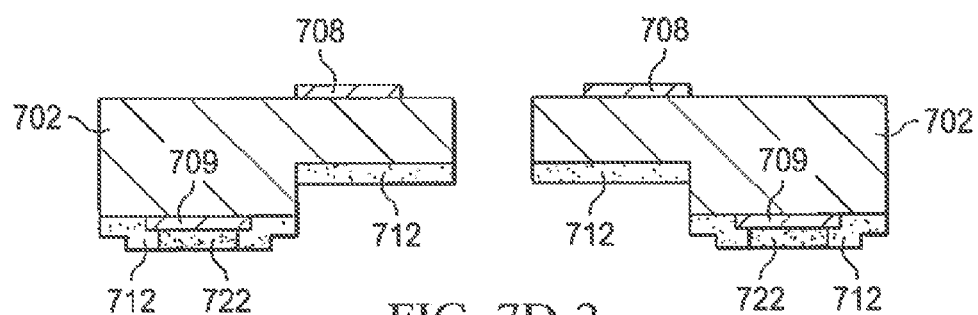
Figures 3, 7D:
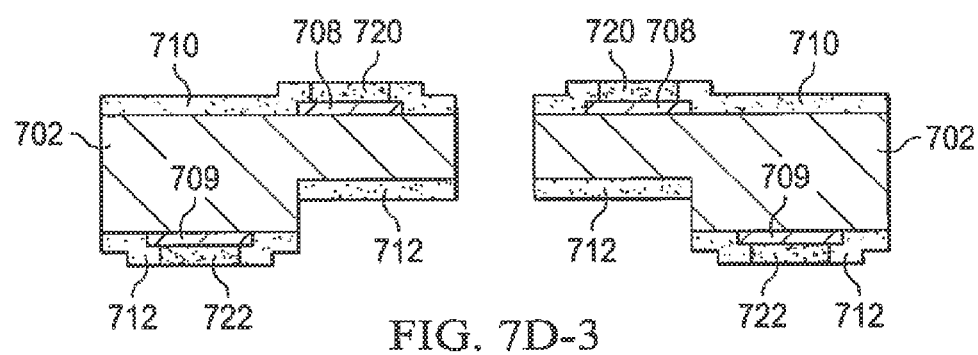
Figures 4, 7D:
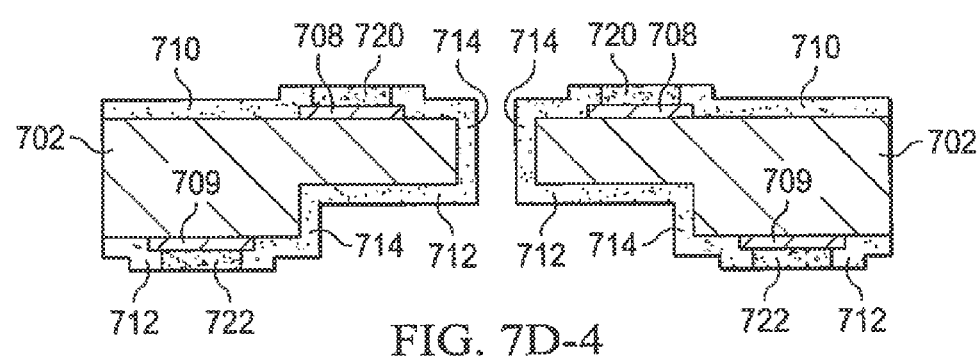

The embodiment lead frame structure shown in FIG. 7C-4 may be formed using electro deposition of the photo-imageable adhesion layers 710, 712, and 714. Electro deposition deposits the photo-imageable adhesion layers 710, 712, and 714 on horizontal and vertical surfaces of the lead frame 702. The photo-imageable adhesion layers 710, 712, and 714 may be a photo-imageable, electroplateable ink, for example.

The plan view of the top side of an embodiment lead frame 702 coated with the adhesion layer 710 is shown in FIG. 8C.

FIGS. 7D-1, 7D-2, 7D-3, and 7D-4 illustrate the lead frames of FIGS. 7C-1, 70-2, 7C-3 and 7C-4 after the photo-imageable adhesion layers 710, 712, and 714 are exposed to form openings over the solderable or wire bond pads 708 and the lead frame surface mount pads 709. Photo-imageable adhesion layers 710, 712, 714 that polymerize becoming insoluble when exposed to light are used for illustration. A bond pad exposure blocking mask prevents light from polymerizing the photo-Imageable adhesion layers 710, 712, and 714 in areas 720 over the solderable or wire bond pads 708 and in areas 722 over the lead frame surface mount pads 709. A top side plan view of FIGS. 7D-1, 7D-3, and 7D-4 is shown in FIG. 8D with crosslinked insoluble photo-imageable adhesion layer 710 over a portion of the lead frame 702 and with unexposed soluble photo-imageable adhesion layer 720 over a central portion of the solderable or wire bond pads 708.

FIGS. 7E-1, 7E-2, 7E-3 and 7E-4 illustrate the lead frames of FIGS. 7D-1, 7D-2, 7D-3, and 7D-4 after the unexposed soluble photo-imageable adhesion layers 720 and 722 are developed to form openings 730 over the solderable or wire bond pads 708 on the top side of the lead frame 702 and are developed to form openings 732 over the lead frame surface mount pads 709 on the bottom side.

The size of the opening 730 in the photo-imageable adhesion layer 710 is smaller than the size of the underlying solderable pad or wire bond pad 708. The size of the opening 732 in the photo-imageable adhesion layer 712 is smaller than the size of the underlying lead frame surface mount pad 709. The smaller size of openings 730 and 732 limits the lateral reflow of solder during solder joint formation. The reduced lateral reflow results in the formation of solder joints with an increased height. The increased solder joint height results in reduced solder joint failures.

The adhesion layers 710, 712, and 714 adhere strongly to the underlying lead frame 702. In addition, the molding compound 112 adheres strongly to the adhesion layers 710, 712, and 714. The adhesion layers 710, 712, and 714 may form strong covalent bonds between the adhesion layers 710, 712, 714 and the molding compound 112. As a result, the adhesion layers 710, 712, and 714 may reduce delamination of the molding compound 112 from the lead frame 702 during moisture sensitivity level preconditioning (MSL) and during thermal cycling. Therefore, the adhesion layers 710, 712, and 714 may improve yield and reliability.

Figures 1, 7E:
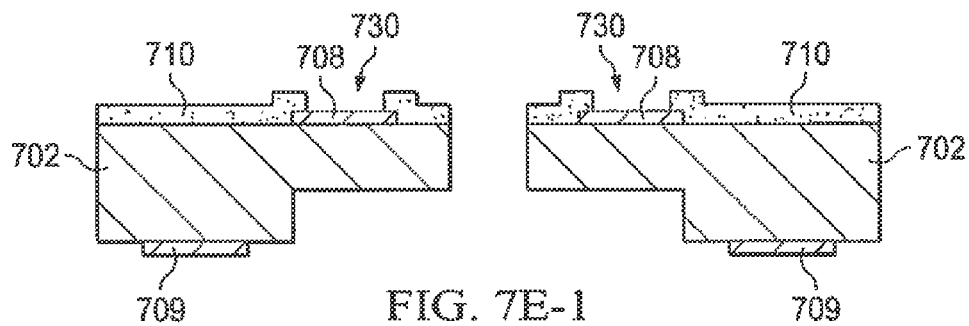
Figures 2, 7E:
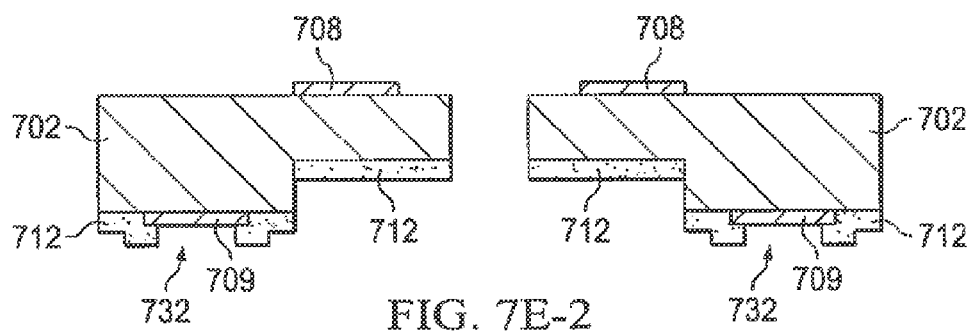
Figures 3, 7E:
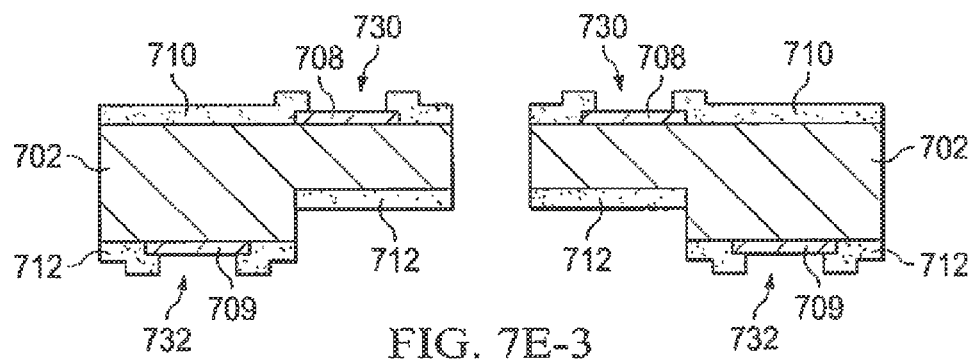
Figures 4, 7E:
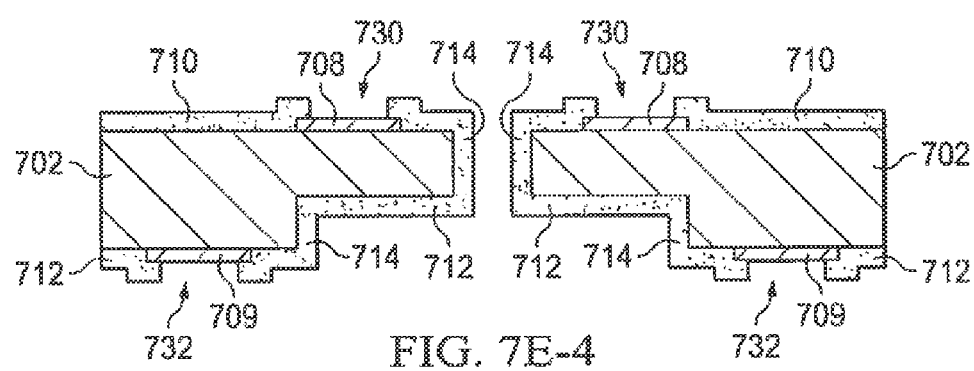

A packaged version of the embodiment lead fame in FIG. 7E-1 is illustrated in FIG. 3B. In FIG. 38B, the adhesion layer 302 partially covers and limits the area of the solderable or wire-bond pads 104 exposed during the flip chip soldering of the IC chip 110 (FIG. 3B) to the lead frame 102. This limits the amount of solder reflow, thereby increasing the distance 115 between the IC chip 110 and the lead frame 102. The increased distance 115 may reduce the stress on the solder joint 308 caused by differences between the coefficients of thermal expansion of the lead frame 102 and the IC chip 110. The reduced stress may result in reduced solder joint 308 failures.

A second method of forming an embodiment lead frame with adhesion layer is described in the cross sections of selected manufacturing steps in FIGS. 9A through 9F and the corresponding top down views in FIGS. 10A through 10F.

Figure 9A:
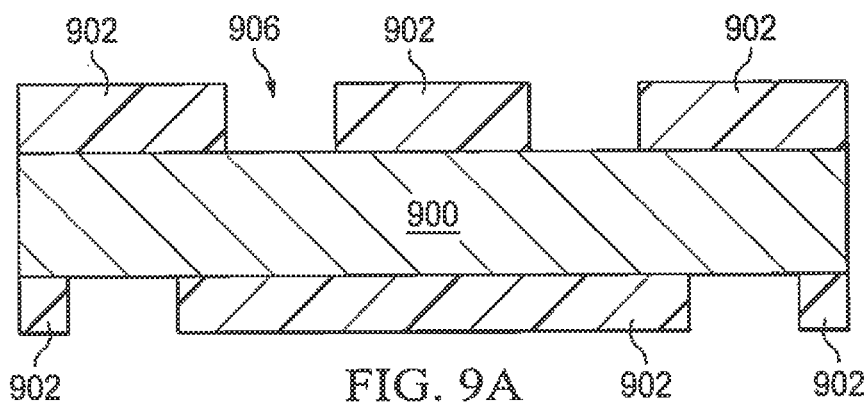
FIGS. 9A through 9F are cross sections of the embodiment lead frame of FIG. 3E depicted in successive stages of fabrication using a second method.
Figure 10A:
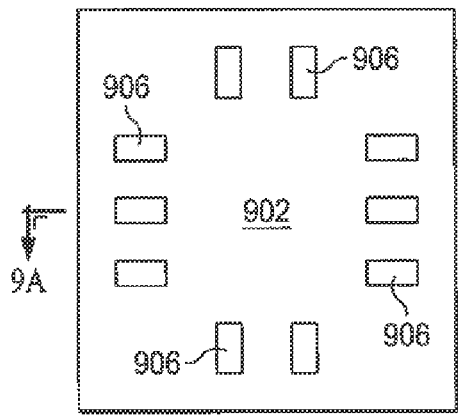
FIGS. 10A through 10F are plan views of the embodiment lead frame of FIG. 3E depicted in successive stages of fabrication using the second method.

FIG. 9A shows a lead frame blank 900 with a bond pad pattern 902. Openings 906 in the bond pad pattern 902 enable solderable pads or wire bond pads 908 to be electroplated onto the top side of the lead frame blank 900 and enable lead frame surface mount pads 909 to be electroplated onto the bottom side of the lead frame blank 900. The top side view of FIG. 10A shows the lead frame blank 900 with the bond pad pattern 902 and openings 906 in the bond pad pattern 902.

Figure 9B:
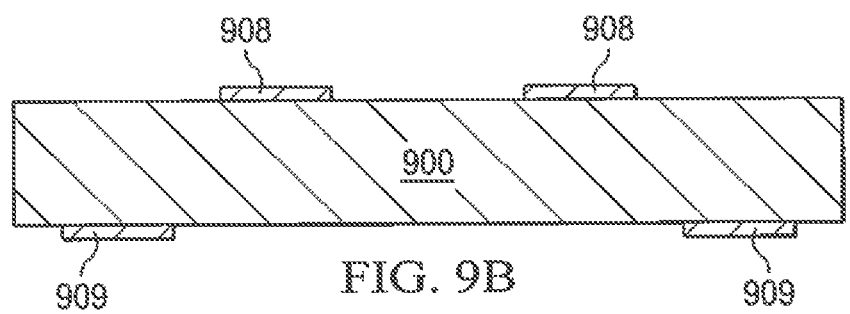
Figure 10B:
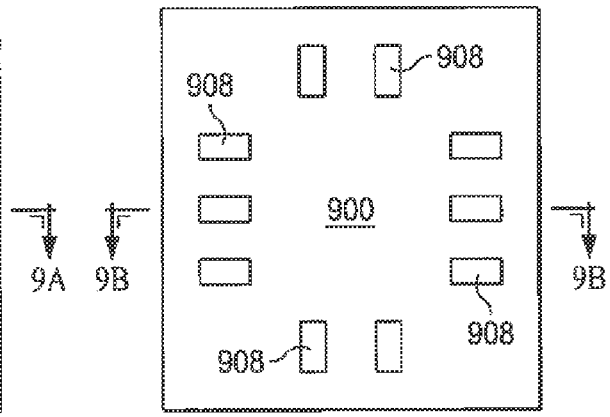
Figure 10C:
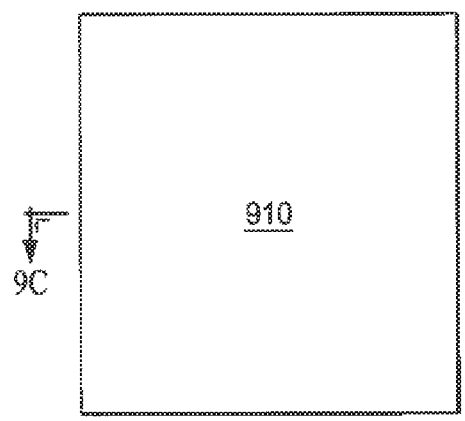
Figure 10D:
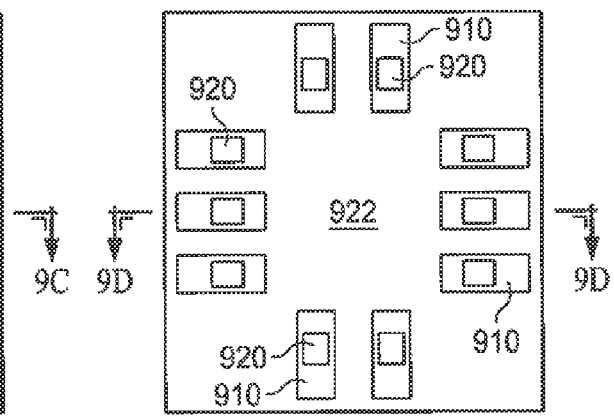

FIG. 9B shows the lead frame blank 900 with electroplated solderable pads or wire bond pads 908 on the top side of the lead frame blank 900 and with electroplated surface mount pads 909 on the bottom side. FIG. 10B shows a plan view of the lead frame blank 900 with solderable or wire bond pads 908.

Figure 9C:
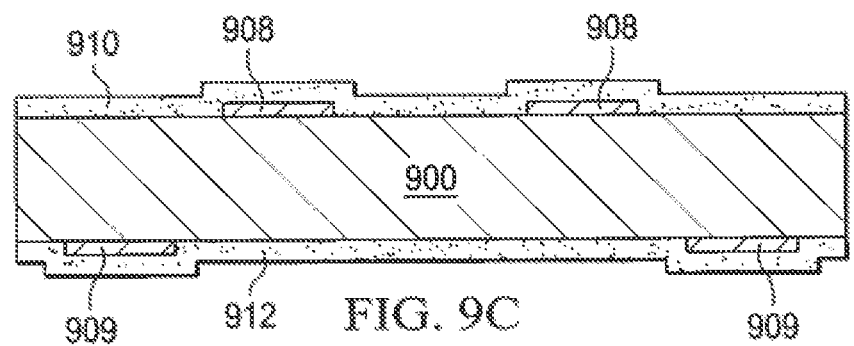

FIG. 9C shows the lead frame and solderable or wire bond pads 908 after they are coated with the photo-imageable adhesion layers 910 and 912. Photo-imageable adhesion layers, 910 and 912, may be an organic material similar to that used to build-up circuit boards. These organic materials may be a photo-imageable polyimide or epoxy material and may be deposited by roller coating, screen printing, ink jet printing or may be electro coated using an ink. The photo-imageable adhesion layers, 910 and 912, used to illustrate this embodiment may be formed of a photo sensitive polymer that cross links and becomes insoluble when exposed to light.

Figure 9D:
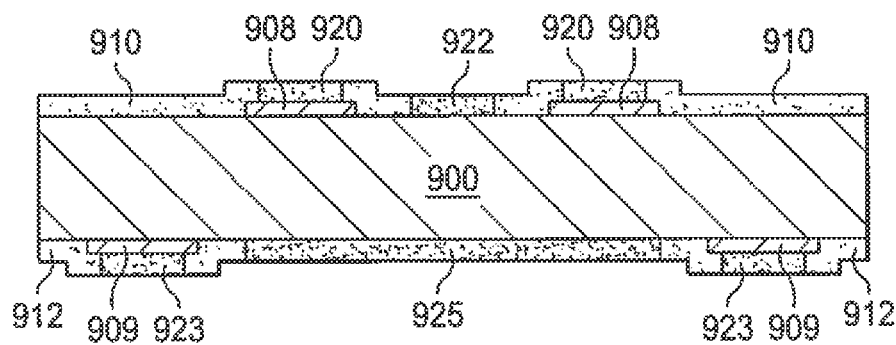

In FIG. 9D a first bond pad and lead frame exposure blocking mask is used to expose the photo-imageable adhesion layer 910 on the topside of the lead frame blank 900. Light is blocked from areas where the photo-imageable adhesion layer 910 is to be later removed by developing. These areas include regions 920 over a central portion of solderable pads 908 or wire bond pads 908, and regions 922 over the lead frame blank 900 that are to be etched away to form the lead frame 902.

A second bond pad and lead frame exposure blocking mask is used to expose the photo-imageable adhesion layer 912 on the bottom side of the lead frame blank 900. Light is blocked from areas where the photo-imageable adhesion layer 912 is to be removed by developing. These areas include regions 923 over a central portion of the lead frame surface mount pads 909 and regions 925 over the lead frame blank 900 that are to be etched away to form the lead frame 902.

Figure 9E:
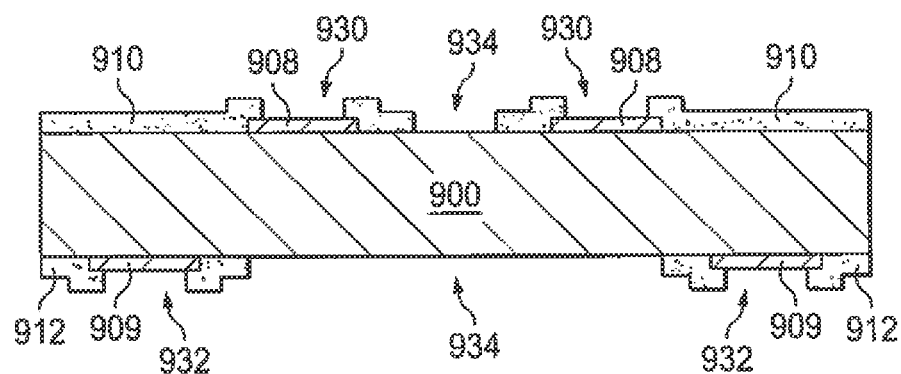
Figure 10E:
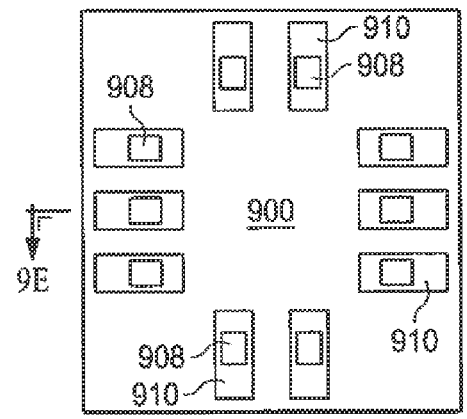

FIG. 9E shows the lead frame blank 900 after the photo-imageable adhesion layers 910 and 912 are developed to form openings, 930, over the solderable pads or the wire-bond pads 908 and to form openings 932 over the surface mount pads 909. Openings 934 are also formed where the lead frame blank 900 is to be etched. FIG. 10E is a top side plan view after the photo-imageable adhesion layer 910 is developed to form openings 934 where the solder blank 900 is to be etched and to form openings 930 over the solderable pads 908.

Figure 9F:
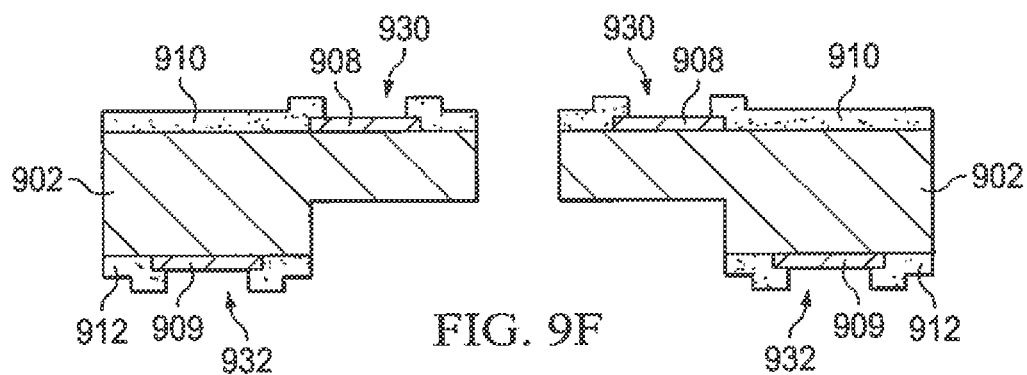

FIG. 9F shows the lead frame 902 after the lead frame blank 900 is etched away to form the embodiment lead frames 902. The horizontal surfaces are coated with the adhesion layers 910 and 912. The photo-imageable adhesion layer 910 and the solderable pads 908 or wire bond pads 908 may function as an etching mask during the etching step that forms the lead frames 902. The lead frame blank 900 may be etched using a ferrous chloride solution, for example.

Figure 10F:
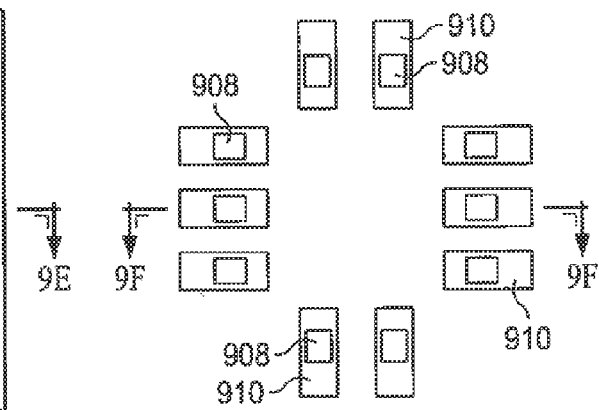

FIG. 10F shows a plan view of the completed lead frame 902. The photo-imageable adhesion layer 910 partially covers the lead frames 902 and covers an outer portion of the solderable pads 908 or the wire bond pads 908.

Figure 11A:
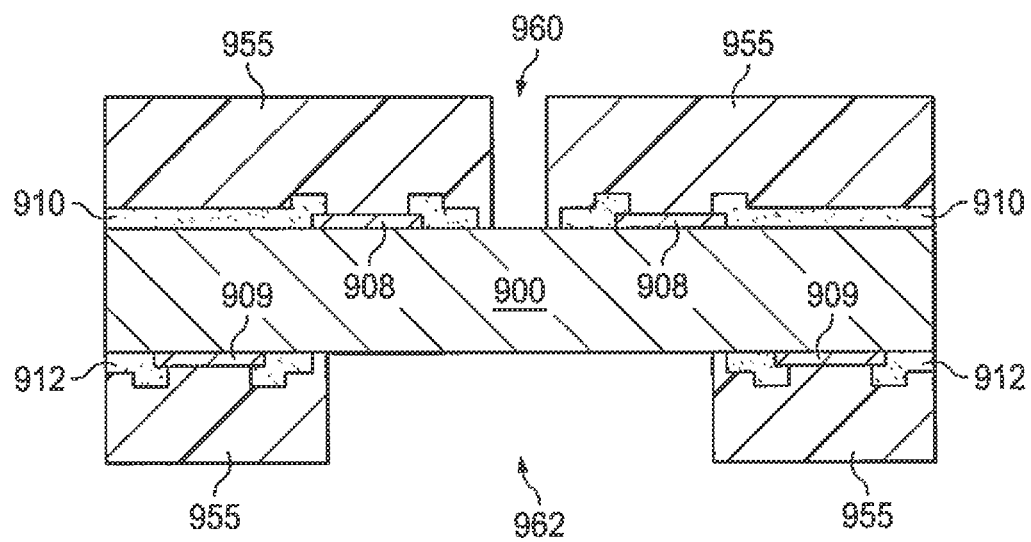
FIGS. 11A and 11B are cross sections of the embodiment lead frame of FIG. 3E depicted in successive stages of fabrication using a third method.
Figure 11B:
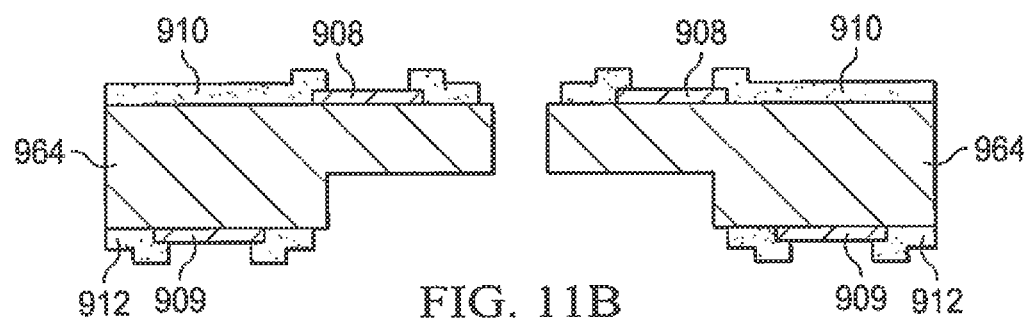

Alternatively, as illustrated in FIGS. 11A and 11B, a lead frame etch pattern 955 having openings 960 and 962 where the lead frame blank 900 is to be etched may be formed using conventional methods such as photoresist patterning. The lead frame blank 900 metal may then be etched to form the lead frames 964. The lead frame etch pattern 955 may then be removed. This method may be preferred when the etchant used to etch the lead frame blank 900 may attack the metal of a solderable pad 908, wire-bond pad 908, or the lead frame surface mount pad 909 if they are not protected during the etch.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A process of forming a lead frame structure, comprising:
   providing a lead frame;
   forming a solderable pad or a wire bond pad on a top horizontal surface of the lead frame;
   forming a lead frame surface mount pad on a bottom horizontal surface of the lead frame;
   forming a polyimide photo-imageable adhesion layer over a portion of the top horizontal surface of the lead frame, a portion of the bottom horizontal surface of the lead frame, a portion of outer edges of the solderable pad or wire bond pad, and over a portion of outer edges of the lead frame surface mount pad;
   using a blocking mask to block light from exposing the polyimide photo-imageable adhesion layer in a central region over the solderable pad or wire bond pad, and a central region over the lead frame surface mount pad; and
   developing unexposed portions of the polyimide photo-imageable adhesion layer to form an opening in the polyimide photo-imageable adhesion layer over the solderable pad or wire bond pad, and to form an opening in the polyimide photo-imageable adhesion layer over the lead frame surface mount pad.

2. The process of claim 1, wherein forming the polyimide photo-imageable adhesion layer comprises roller coating, screen printing, ink jet printing or comprises electro coating with an ink.

3. The process of claim 1, wherein the polyimide photo-imageable adhesion layer has a thickness in the range of 1 um to 50 um.

4. A process of forming a lead frame structure, comprising:
   providing a lead frame blank;
   forming a solderable pad or a wire bond pad on a top horizontal surface of the lead frame blank;
   forming a lead frame surface mount pad on a bottom horizontal surface of the lead frame blank;
   forming a polyimide photo-imageable adhesion layer over a portion of the top horizontal surface of the lead frame blank, a portion of the bottom horizontal surface of the lead frame blank, over the solderable pad or wire bond pad, and over the surface mount pad;

using a first blocking mask to block light from exposing the polyimide photo-imageable adhesion layer over a central region of the solderable pad or wire bond pad, and over the top horizontal surface of the lead frame blank where the lead frame blank is to be etched to form the lead frames;

using a second blocking mask to block light from exposing the polyimide photo-imageable adhesion layer over a central portion of the lead frame surface mount pad, and over the bottom horizontal surface of the lead frame blank where the lead frame blank is to be etched to form the lead frames;

developing unexposed portions of the polyimide photo-imageable adhesion layer to form an opening in the polyimide photo-imageable adhesion layer over the solderable pad or wire bond pad, to form an opening in the polyimide photo-imageable adhesion layer over the lead frame surface mount pad, and to form an opening in the polyimide photo-imageable adhesion layer over the lead frame blank; and etching lead frame blank to form the lead frames.

5. The process of claim 4, wherein the polyimide photo-imageable adhesion layer is used as an etch mask during the etch of the lead frame blank.

6. The process of claim 4, further comprising the steps:
prior to the step of etching the lead frame blank, forming a lead frame etch pattern over the top horizontal surface of the lead frame blank and the bottom horizontal surface, the lead frame etch pattern having openings where the lead frame blank is to be etched; and removing the lead frame etch pattern after the etch of the lead frame blank.

7. A process of forming a lead frame structure, comprising:

providing a lead frame;

forming a solderable pad or a wire bond pad on a top horizontal surface of the lead frame;

forming a lead frame surface mount pad on a bottom horizontal surface of the lead frame;

forming an epoxy photo-imageable adhesion layer over a portion of the top horizontal surface of the lead frame, a portion of the bottom horizontal surface of the lead frame, a portion of outer edges of the solderable pad or wire bond pad, and over a portion of outer edges of the lead frame surface mount pad;

using a blocking mask to block light from exposing the epoxy photo-imageable adhesion layer in a central region over the solderable pad or wire bond pad, and a central region over the lead frame surface mount pad; and developing unexposed portions of the epoxy photo-imageable adhesion layer to form an opening in the epoxy photo-imageable adhesion layer over the solderable pad or wire bond pad, and to form an opening in the epoxy photo-imageable adhesion layer over the lead frame surface mount pad.

8. The process of claim 7, wherein forming the epoxy photo-imageable adhesion layer comprises roller coating, screen printing, ink jet printing or comprises electro coating with an ink.

9. The process of claim 7, wherein the polyimide photo-imageable adhesion layer has a thickness in the range of 1 um to 50 um.

10. A process of forming a lead frame structure, comprising:

providing a lead frame blank;

forming a solderable pad or a wire bond pad on a top horizontal surface of the lead frame blank;

forming a lead frame surface mount pad on a bottom horizontal surface of the lead frame blank;

forming an epoxy photo-imageable adhesion layer over a portion of the top horizontal surface of the lead frame blank, a portion of the bottom horizontal surface of the lead frame blank, over the solderable pad or wire bond pad, and over the surface mount pad;

using a first blocking mask to block light from exposing the epoxy photo-imageable adhesion layer over a central region of the solderable pad or wire bond pad, and over the top horizontal surface of the lead frame blank where the lead frame blank is to be etched to form the lead frames;

using a second blocking mask to block light from exposing the epoxy photo-imageable adhesion layer over a central portion of the lead frame surface mount pad, and over the bottom horizontal surface of the lead frame blank where the lead frame blank is to be etched to form the lead frames;

developing unexposed portions of the epoxy photo-imageable adhesion layer to form an opening in the epoxy photo-imageable adhesion layer over the solderable pad or wire bond pad, to form an opening in the epoxy photo-imageable adhesion layer over the lead frame surface mount pad, and to form an opening in the epoxy photo-imageable adhesion layer over the lead frame blank; and etching lead frame blank to form the lead frames.

11. The process of claim 10, wherein the epoxy photo-imageable adhesion layer is used as an etch mask during the etch of the lead frame blank.

12. The process of claim 10, further comprising the steps:
prior to the step of etching the lead frame blank, forming a lead frame etch pattern over the top horizontal surface of the lead frame blank and the bottom horizontal surface, the lead frame etch pattern having openings where the lead frame blank is to be etched; and removing the lead frame etch pattern after the etch of the lead frame blank.

13. A process of forming a packaged integrated circuit (IC), comprising:

providing a lead frame;

forming a solderable pad or a wire bond pad on a top horizontal surface of the lead frame;

forming a lead frame surface mount pad on a bottom horizontal surface of the lead frame;

forming a polyimide photo-imageable adhesion layer over a portion of the top horizontal surface of the lead frame, a portion of the bottom horizontal surface of the lead frame, a portion of outer edges of the solderable pad or wire bond pad, and over a portion of outer edges of the lead frame surface mount pad;

using a blocking mask to block light from exposing the polyimide photo- imageable adhesion layer in a central region over the solderable pad or wire bond pad, and a central region over the lead frame surface mount pad;

developing unexposed portions of the polyimide photo-imageable adhesion layer to form an opening in the polyimide photo-imageable adhesion layer over the solderable pad or wire bond pad, and to form an opening in the polyimide photo-imageable adhesion layer over the lead frame surface mount pad;

attaching an IC chip to the solderable pad; and encapsulating the IC chip and lead frame in molding compound.

14. The process of claim 13, wherein forming the polyimide photo-imageable adhesion layer comprises roller coating, screen printing, ink jet printing or comprises electro coating with an ink.

15. The process of claim 13, wherein the polyimide photo-imageable adhesion layer has a thickness in the range of 1 um to 50 um.

16. A process of forming a packaged integrated circuit (IC), comprising:

providing a lead frame blank;

forming a solderable pad or a wire bond pad on a top horizontal surface of the lead frame blank;

forming a lead frame surface mount pad on a bottom horizontal surface of the lead frame blank;

forming a polyimide photo-imageable adhesion layer over a portion of the top horizontal surface of the lead frame blank, a portion of the bottom horizontal surface of the lead frame blank, over the solderable pad or wire bond pad, and over the surface mount pad;

using a first blocking mask to block light from exposing the polyimide photo-imageable adhesion layer over a central portion of the solderable pad or wire bond pad, and over the top horizontal surface of the lead frame blank where the lead frame blank is to be etched to form the lead frames;

using a second blocking mask to block light from exposing the polyimide photo-imageable adhesion layer over a central portion of the lead frame surface mount pad, and over the bottom horizontal surface of the lead frame blank where the lead frame blank is to be etched to form the lead frames;

developing unexposed portions of the polyimide photo-imageable adhesion layer to form an opening in the polyimide photo-imageable adhesion layer over the solderable pad or wire bond pad, to form an opening in the polyimide photo-imageable adhesion layer over the lead frame surface mount pad, and to form an opening in the polyimide photo-imageable adhesion layer over the lead frame blank;

etching the lead frame blank to form a lead frame;

attaching an IC chip to the solderable pad; and encapsulating the IC chip and lead frame in molding compound.

17. The process of claim 16, wherein the polyimide photo-imageable adhesion layer is used as an etch mask during the etch of the lead frame blank.

18. The process of claim 16, further comprising the steps:

prior to the step of etching the lead frame blank, forming a lead frame etch pattern over the top horizontal surface of the lead frame blank and the bottom horizontal surface, the lead frame etch pattern having openings where the lead frame blank is to be etched; and removing the lead frame etch pattern after the etch of the lead frame blank.

19. A process of forming a packaged integrated circuit (IC), comprising:

providing a lead frame;

forming a solderable pad or a wire bond pad on a top horizontal surface of the lead frame;

forming a lead frame surface mount pad on a bottom horizontal surface of the lead frame;

forming an epoxy photo-imageable adhesion layer over a portion of the top horizontal surface of the lead frame, a portion of the bottom horizontal surface of the lead frame, a portion of outer edges of the solderable pad or wire bond pad, and over a portion of outer edges of the lead frame surface mount pad;

using a blocking mask to block light from exposing the epoxy photo-imageable adhesion layer in a central region over the solderable pad or wire bond pad, and a central region over the lead frame surface mount pad; and developing unexposed portions of the epoxy photo-imageable adhesion layer to form an opening in the epoxy photo-imageable adhesion layer over the solderable pad or wire bond pad, and to form an opening in the epoxy photo-imageable adhesion layer over the lead frame surface mount pad;

attaching an IC chip to the solderable pad; and encapsulating the IC chip and lead frame in molding compound.

20. The process of claim 19, wherein forming the epoxy photo-imageable adhesion layer comprises roller coating, screen printing, ink jet printing or comprises electro coating with an ink.

21. The process of claim 19, wherein the epoxy photo-imageable adhesion layer has a thickness in the range of 1 um to 50 um.

22. A process of forming a packaged integrated circuit (IC), comprising:

providing a lead frame blank;

forming a solderable pad or a wire bond pad on a top horizontal surface of the lead frame blank;

forming a lead frame surface mount pad on a bottom horizontal surface of the lead frame blank;

forming an epoxy photo-imageable adhesion layer over a portion of the top horizontal surface of the lead frame blank, a portion of the bottom horizontal surface of the lead frame blank, over the solderable pad or wire bond pad, and over the surface mount pad;

using a first blocking mask to block light from exposing the epoxy photo-imageable adhesion layer over a central portion of the solderable pad or wire bond pad, and over the top horizontal surface of the lead frame blank where the lead frame blank is to be etched to form the lead frames;

using a second blocking mask to block light from exposing the epoxy photo-imageable adhesion layer over a central portion of the lead frame surface mount pad, and over the bottom horizontal surface of the lead frame blank where the lead frame blank is to be etched to form the lead frames;

developing unexposed portions of the epoxy photo-imageable adhesion layer to form an opening in the epoxy photo-imageable adhesion layer over the solderable pad or wire bond pad, to form an opening in the epoxy photo-imageable adhesion layer over the lead frame surface mount pad, and to form an opening in the epoxy photo-imageable adhesion layer over the lead frame blank; and etching the lead frame blank to form a lead frame;

attaching an IC chip to the solderable pad; and encapsulating the IC chip and lead frame in molding compound.

23. The process of claim 22, wherein the epoxy photo-imageable adhesion layer is used as an etch mask during the etch of the lead frame blank.

24. The process of claim 22, further comprising the steps:

prior to the step of etching the lead frame blank, forming a lead frame etch pattern over the top horizontal surface of the lead frame blank and the bottom horizontal surface, the lead frame etch pattern having openings where the lead frame blank is to be etched; and removing the lead frame etch pattern after the etch of the lead frame blank.

* * * * *